United States Patent
Choi et al.

(10) Patent No.: US 7,615,581 B2
(45) Date of Patent: Nov. 10, 2009

(54) BLACK PASTE COMPOSITE, UPPER PLATE OF PLASMA DISPLAY PANEL, AND MANUFACTURING METHOD BY USING THE SAME

(75) Inventors: Jong Hyung Choi, Chungcheongbuk-do (KR); Keun Soo Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 458 days.

(21) Appl. No.: 11/504,643

(22) Filed: Aug. 16, 2006

(65) Prior Publication Data

US 2007/0040504 A1    Feb. 22, 2007

(30) Foreign Application Priority Data

Aug. 17, 2005   (KR) .................. 10-2005-0075312

(51) Int. Cl.
   G03F 7/027   (2006.01)
   G03F 7/028   (2006.01)
   G03F 7/032   (2006.01)

(52) U.S. Cl. .................. 522/81; 522/83; 524/401; 524/434

(58) Field of Classification Search ............ 522/81, 522/83; 524/401, 434
See application file for complete search history.

(56) References Cited

U.S. PATENT DOCUMENTS

| | | | | |
|---|---|---|---|---|
| 5,814,434 | A * | 9/1998 | Nakamura et al. | 430/25 |
| 6,001,533 | A * | 12/1999 | Sega et al. | 430/270.1 |
| 6,075,319 | A * | 6/2000 | Kanda et al. | 313/584 |
| 6,251,548 | B1 * | 6/2001 | Sega et al. | 430/7 |

(Continued)

FOREIGN PATENT DOCUMENTS

EP    0 740 183 A1    10/1996

(Continued)

OTHER PUBLICATIONS

JP 10231441 A, Terada et al., Sep. 1998, English Abstract.*

(Continued)

*Primary Examiner*—Satya B Sastri
(74) *Attorney, Agent, or Firm*—Birch, Stewart, Kolasch & Birch, LLP

(57) ABSTRACT

The present invention relates to a black paste composition and an upper plate of plasma display panel using the same. The upper plate of plasma display panel comprises an upper substrate, a transparent electrode disposed on a predetermined position of the upper substrate, a bus electrode disposed on a predetermined position of the transparent electrode and a black matrix disposed between the transparent electrode and the bus electrode, and in each discharge cell.

The black paste composition comprises about 5 to 25 parts by weight of a heat resistant black pigment; about 5 to 20 parts by weight of a glass powder; about 25 to 30 parts by weight of a binder; about 5 to 15 parts by weight of a photopolymerization monomer; about 1 to 10 parts by weight of a photopolymerization initiator; and about 20 to 35 parts by weight of a solvent.

In the black paste composition and the upper plate of the plasma display panel using the same according to the present invention, the contact resistance between the bus electrode and the transparent electrode is low, the black matrix has a high black rate, and the manufacturing cost is reduced since the black matrix is made of the black paste composition containing $MnCo_2O_4$.

4 Claims, 6 Drawing Sheets

U.S. PATENT DOCUMENTS

| | | | |
|---|---|---|---|
| 6,555,594 B1 * | 4/2003 | Fukushima et al. | 522/81 |
| 2002/0048730 A1 | 4/2002 | Hatori et al. | |
| 2002/0096666 A1 | 7/2002 | Ichikawa et al. | |
| 2003/0102477 A1 | 6/2003 | Lee | |
| 2005/0073255 A1 | 4/2005 | Kim et al. | |

FOREIGN PATENT DOCUMENTS

| | | |
|---|---|---|
| EP | 1 308 982 A2 | 5/2003 |
| EP | 1 589 556 A1 | 10/2005 |
| EP | 1 720 232 A2 | 11/2006 |
| JP | 49124127 A * | 11/1974 |
| JP | 10231441 A * | 9/1998 |
| JP | 2005-183372 A | 7/2005 |
| KR | 10-2002/0060683 | 7/2002 |
| KR | 10-2003/0044667 | 6/2003 |
| KR | 10-2005/0032849 | 4/2005 |
| WO | WO-2005/052976 A1 | 9/2005 |

OTHER PUBLICATIONS

JP 49124127 A, Nov. 1974, Derwent Abs.*

* cited by examiner

FIG. 1A

RELATED ART

FIG. 1B

RELATED ART

FIG. 1C

RELATED ART

FIG. 1D

RELATED ART

FIG. 1E

RELATED ART

FIG. 1F

RELATED ART

BLACK PASTE COMPOSITE, UPPER PLATE OF PLASMA DISPLAY PANEL, AND MANUFACTURING METHOD BY USING THE SAME

CROSS-REFERENCE TO RELATED APPLICATIONS

This application claims priority from Korean Patent Application No. 10-2005-0075312 filed on Aug. 17, 2005, the content of which is incorporated herein by reference in its entirety.

BACKGROUND OF THE INVENTION

1. Field of the Invention

The present invention relates to an upper plate of plasma display panel, and a manufacturing method thereof. Particularly, the present invention relates to a black paste composition capable of improving the property of a black matrix, and a plasma display panel using the same.

2. Description of the Related Art

Plasma display panel (PDP) is a flat panel display device that can display images or information by using a light-emitting phenomenon from plasma discharge. PDP is generally divided into DC-type and AC-type according to panel structure and driving method.

PDP generates plasma discharge in each cell separated by barrier ribs. Thus, PDP is a display device using the light emitting phenomenon of visible rays generated from the energy difference when ultraviolet rays generated by plasma discharge of a gas (such as He, Xe, etc.) provided in each cell returns to the ground state by exciting a phosphor in the cell.

PDP has several advantages such as simple structure, easy manufacturing due to simple structure, high brightness, high luminous efficacy, memory capacity effect, and a wide viewing angle over 160°. Also, PDP can be used for wide screens of 40 or more inches.

FIGS. 1A-1F are cross-sectional views illustrating the steps of forming the upper plate of a common PDP in the art.

Figure 1A:
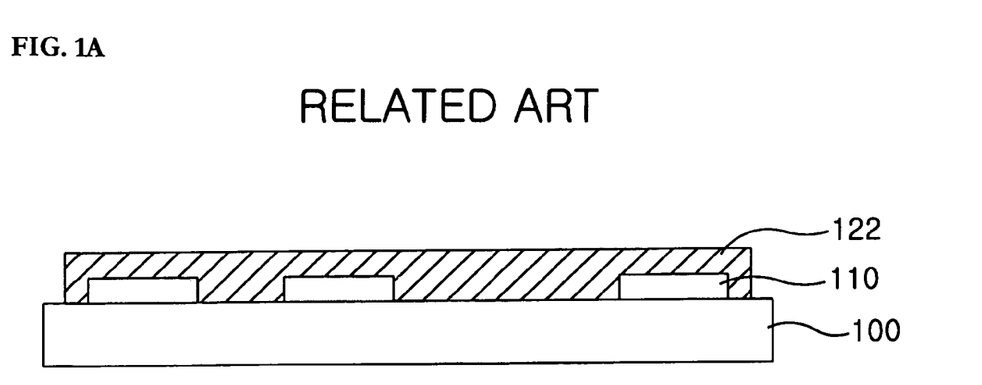
FIGS. 1A-1F are cross-sectional views illustrating the steps of forming the upper plate of PDP in the art.

First, as shown in FIG. 1A, a black paste composition 122 is applied on an upper substrate 100 at the state that a transparent electrode 110 consisted of ITO, etc. is already formed by a process, for example, sputtering, ion plating, chemical depositing or electrodepositing.

The black paste composition 122 is RuO compound.

Figure 1B:
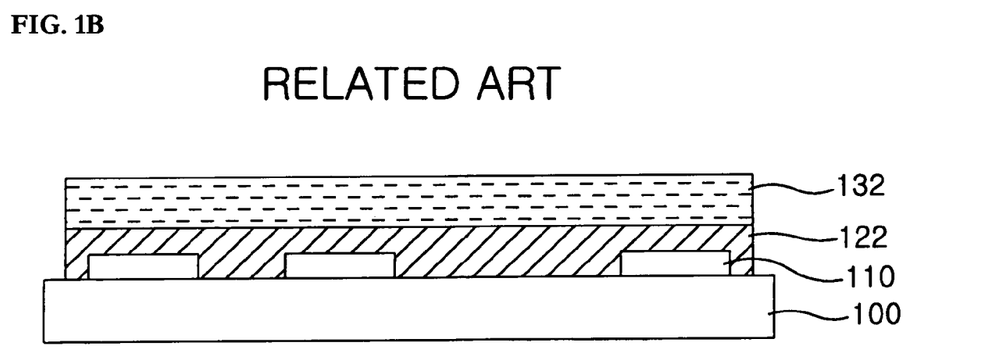

Then, an electrode material 132 is applied as shown in FIG. 1B.

Figure 1C:
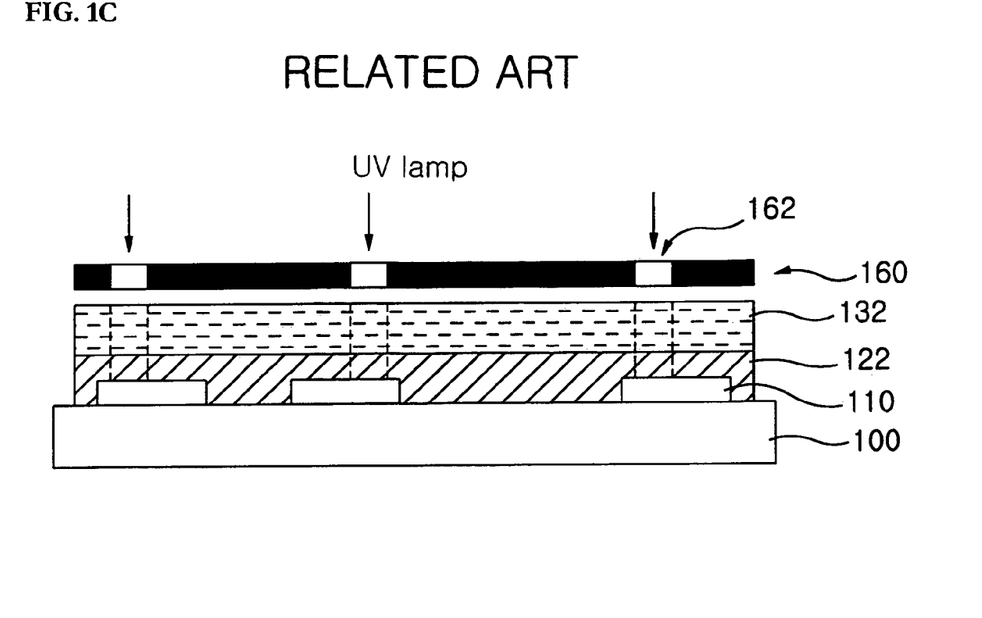

Subsequently, a first mask 160 having a certain opening 162 is disposed on the upper substrate 100 on which the electrode material 132 is applied. The first mask 160 has the opening 162 at a position corresponding to a bus electrode 130, as shown in FIG. 1C.

The first mask was exposed to light by irradiating a UV lamp from top of the first mask 160 for a certain period of time.

Then, after the first mask 160 is removed, the upper substrate 100 is developed by using a developer.

Figure 1D:
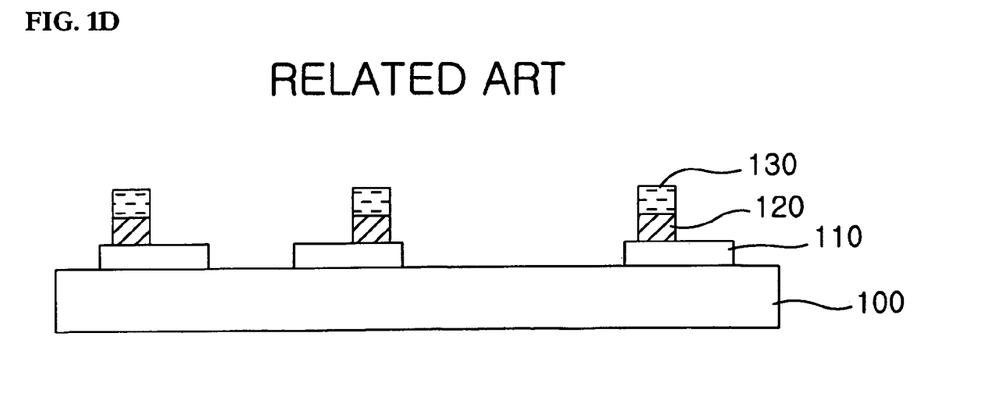

As a result, the electrode material 132 and the black paste composition 122 in the other parts are removed, with only leaving cured parts in response to the UV lamp, as shown in FIG. 1D. Then, a sintering process is carried out thereto.

Figure 1E:
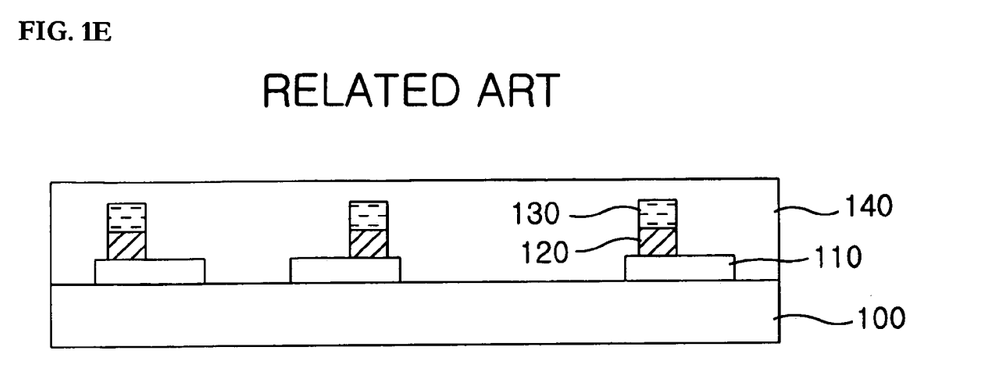

And, a dielectric layer material is applied on the upper substrate 100 on which the first black matrix 120 and the bus electrode 130 are formed, and dried to form an upper dielectric layer 140, as shown in FIG. 1E.

Figure 1F:
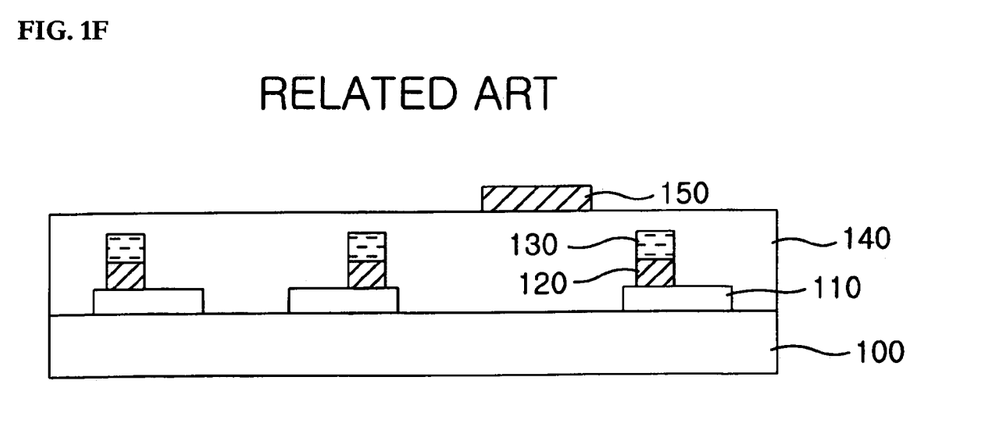

Then, the black paste composition 122 is re-applied on top of the upper dielectric layer 140. A second black matrix 150 is formed in each discharge cell through performing the developing and sintering processed thereto, as shown in FIG. 1F.

Subsequently, the manufacturing process of the upper plate of PDP is completed through forming one more dielectric layer (not shown) or a protection layer (not shown), on top of the upper dielectric layer 140 on which the second black matrix 150 is formed.

In case of manufacturing the upper plate of PDP through the above steps, the first and second black matrixes 120 and 150 are formed through two steps. That is, to form the first black matrix 120 disposed between the transparent electrode 110 and the bus electrode 120, the black paste composition 122 is applied, and the light-exposing, developing, and sintering processes are followed.

Also, to form the second black matrix 150 disposed in each discharge cell, the black paste composition 122 is applied, and the light-exposing, developing, and sintering processes are followed.

Thus, the manufacturing process becomes complicated, and the manufacturing cost as well as the manufacturing time is increased.

Also, the RuO compound used as the black paste composition 122 is very expensive, thereby increasing the manufacturing cost.

SUMMARY OF THE INVENTION

One object of the present invention is to provide a black paste composition containing $MnCo_2O_4$, and an upper plate of PDP that has low contact resistance between the bus electrode and the transparent electrode, and a high black rate of black matrix, and can reduce the manufacturing cost, by forming the black matrix with the black paste composition.

Another object of the present invention is to provide a black paste composition and an upper plate of PDP by using the black paste composition, wherein the manufacturing process is simplified and the manufacturing cost can be reduced, by forming the bus electrode and the black matrix at the same time.

The black paste composition for black matrix according to the present invention comprises about 5 to 25 parts by weight of a heat resistant black pigment; about 5 to 20 parts by weight of a glass powder; about 25 to 30 parts by weight of a binder; about 5 to 15 parts by weight of a photopolymerization monomer; about 1 to 10 parts by weight of a photopolymerization initiator; and about 20 to 35 parts by weight of a solvent.

The upper plate of PDP according to the present invention comprises an upper substrate; a transparent electrode disposed on a predetermined position of the upper substrate; a bus electrode disposed on a predetermined position of the transparent electrode; and a black matrix disposed between the transparent electrode and the bus electrode. The black matrix comprises a heat resistant black pigment; and a glass powder, wherein the content ratio of the glass powder:the heat resistant black pigment fall within a range between about 1:0.5 and about 1:3.

The manufacturing method of the upper plate of PDP according to the present invention comprises applying a black paste composition on a substrate on which a transparent electrode is formed; drying the black paste composition; exposing a certain area of the black paste composition to light for forming a first black matrix; applying an electrode material onto the black paste composition; drying the electrode material; exposing the certain area of the black paste composition and the electrode material to light for forming a second black matrix and a bus electrode; developing the black paste composition and the electrode material; and forming the bus electrode, and the first and second black matrixes by sintering the black paste composition and the electrode material. The black paste composition comprises about 5 to 25 parts by weight of a heat resistant black pigment; about 5 to 20 parts by weight of a glass powder; about 25 to 30 parts by weight of a binder; about 5 to 15 parts by weight of a photopolymerization monomer; about 1 to 10 parts by weight of a photopolymerization initiator; and about 20 to 35 parts by weight of a solvent.

In the black paste composition, and the upper plate of PDP manufactured by using the same, according to the present invention, the contact resistance between the bus electrode and the transparent electrode is low, the black matrix has a high black rate, and the manufacture cost is reduced, since the black matrix is formed by the black paste composition containing $MnCo_2O_4$.

Also, in the black paste composition and the upper plate of PDP, according to the present invention, the bus electrode and the black matrix are formed at the same time, and so the manufacturing process of the upper plate is simplified, and the manufacturing cost is reduced.

DETAILED DESCRIPTION OF THE INVENTION

The present invention will be more clearly understood from a detailed description in conjunction with the following drawings.

Figure 2:
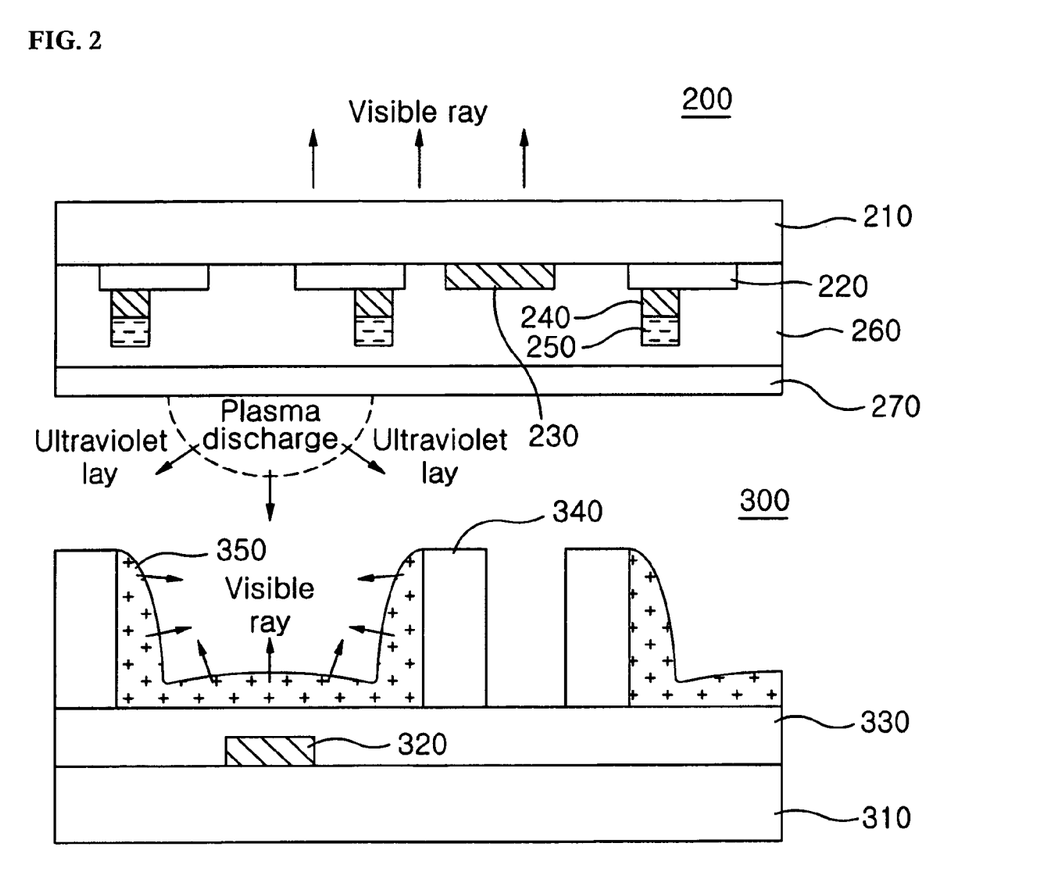
FIG. 2 is a cross-sectional view illustrating the PDP according to one embodiment of the present invention.

FIG. 2 is a cross-sectional view illustrating the plasma display panel according to one embodiment of the present invention.

In FIG. 2, the structure of PDP is divided into an upper plate 200 and a lower plate 300.

In the upper plate 200, transparent electrodes 220, bus electrodes 250, first and second black matrixes 230 and 240, an upper dielectric layer 260, and a protection layer 270 are formed on a lower side of a glass substrate 210 (hereinafter, referred to as "upper substrate").

The transparent electrodes 220 are made of transparent conductive material such as Indium Tin Oxide (hereinafter, referred to as "ITO") so as to transmit a light generated from discharge cells.

The bus electrodes 250 are formed on the transparent electrodes 220 to reduce the line resistance of the transparent electrodes 220.

The bus electrodes 250 are made of silver (Ag) paste having high conductivity. Since the bus electrodes 250 are generally made of a material having high electrical conductivity, they reduce the driving voltage of the transparent electrodes 220 having relatively low electrical conductivity.

The first black matrix 230 is disposed between discharge cells to absorb outside light and inside light transmitted between adjacent discharge cells, thereby enhancing the contrast. And, the first black matrix 230 also divides the discharge cells.

The second black matrix 240 is formed as a very thin layer between the transparent electrodes 220 and the bus electrodes 250, thereby allowing an electric current to pass through between the transparent electrodes 220 and the bus electrodes 250 and enhancing the contrast of PDP.

The first and second black matrixes 230 and 240 are made of a black paste composition. The black paste composition comprises a heat resistant black pigment, a binder, a photopolymerization monomer, a photopolymerization initiator, a glass powder, and a solvent.

The black paste composition comprises about 5 to 25 parts by weight of the heat resistant black pigment, about 5 to 20 parts by weight of the glass powder, about 25 to 30 parts by weight of the binder, about 5 to 15 parts by weight of the photopolymerization monomer, about 1 to 10 parts by weight of the photopolymerization initiator, and about 20 to 35 parts by weight of the solvent.

In the black paste composition, the content ratio of the glass powder:the heat resistant black pigment may fall within the range between about 1:0.5 and about 1:3. In this case, it is assumed that $MnCo_2O_4$ may be used as the heat resistant black pigment.

An black pigment having color stability at a high temperature is used as the heat resistant black pigment. It is because the manufacturing process of the upper substrate of PDP includes a sintering process at a high temperature of between 500° C. to 600° C., and so the heat resistant black pigment should not be discolored at such a high temperature.

In detail, $MnCo_2O_4$ is preferable as the heat resistant black pigment because the black film formed after the sintering process is minute, and the color property is good.

Particularly, a slurry uniformly dispersing the heat resistant black pigment including MnCo2O4 in the solvent is preferable as paste since it has no second coagulation remnant.

The slurry is prepared by uniformly dispersing heat resistant black pigment in solvent. For example, the slurry is prepared by mixing and dispersing solvent, dispersing agent, and heat resistant black pigment, with a mixer.

Also, any dispersing agent may be used for the slurry as long as it can disperse the heat resistant black pigment uniformly.

In the black paste composition, acrylic based material is used as the binder. Also, carboxyl resin, carboxyl photosensitive resin including ethylene unsaturated double bond, or carboxyl resin not including ethylene unsaturated double bond may be used as the binder. The carboxyl photo-sensitive resin and the carboxyl resin can be used alone or in mixture, but it is preferable that the total amount of their contents is between 10% and 80% of the total amount of the black paste composition.

In the black paste composition, the photopolymerization monomer is used for promoting photo-curing of the black paste composition and improving the developing property.

The examples of the photopolymerization monomer are 2-hydroxyethylacrylate, 2-hydroxypropylacrylate, diethyleneglycoldiacrylate, triethylenglycoldiacrylate, polyethylenglycoldiacrylate, polyurethanediacrylate, trimethylpropanetriacrylate, pentaerythritoltriacrylate, pentaerythritoltetraacrylate, triacrylate degenerated trimethylpropaneethyleneoxide, triacrylate degenerated trimethylpropanepropyleneoxide, dipentaerythritolpentaacrylate, dipentaerythritolhexaacrylate, and methacrylate corresponding to the above kinds of acrylate; and mono-, di-, tri-, or more polyester formed with polybasic acid, for example, phthalic acid, adipic acid, maleic acid, atconic acid, succinic acid, trimellitic acid, terephthalic acid, and hydroxyalkyl(metha) acrylate. Also, the above kinds of photopolymerization monomer may be used alone or in combination of two or more kinds. Especially, it is preferable for the photopolymerization monomer to be poly-functional monomer having two more acrylic groups or methacrylic groups in one molecule.

And, the photopolymerization initiator may be one or more selected from the group consisting of benzoinalkylester, for example, benzoin, benzoinmethylaester, benzoinethylester and benzoinisopropylester; acetophenone type, for example, acetophenone, 2.2-dimethoxy-2-phenylacetophenone, 2.2-diethoxy-2-phenylacetophenone, 1.1-dichloroacetophenone; aminoacetophenone type, for example, 2-methyl-1-[4-(methyltio)phenyl]-2-morpolypropane-1-on, 2-benzyl-2-dimethylamino-1-[4-morpolyphenyl]-butane-1-on; anthraquinone type, for example, 2-methylanthraquinone, 2-ethylanthraquinone, 2-t-butylanthraquinone, 1-chloranthraquinone; tioxanthone type, for example, 2.4-dimethyltioxanthone, 2.4-diethyltioxanthone, 2-chlortioxanthone, 2.4-disopropyltioxanthone; ketal type, for example, acetophenonedimethylketal, benxyldimethylketal; benzophenon; phosphineoxide type, for example, (2.6-dimethoxybenzoyl)-2.4.4-pentylphosphineoxide, bis(2.4.6-trimethylbezoyl)-phenylphosphineoxide, 2.4.6-trimethylbenzoyldiphenylphosphineoxide, ethyl-2.4.6-trimethylbenzoyldiphenylphosphinate; and peroxide.

Also, the glass powder, silica powder, etc. may be mixed in a range that they do not damage properties of the black paste composition.

In case the glass powder is added to the black paste composition, a film formed after exposure and developing can be easily sintered under 600° C. or less. It is preferable to use a glass powder comprising at least one selected from the group consisting of a lead oxide, a bismuth oxide, a lithium oxide, or a zinc oxide, as a main component.

Also, a solvent can be mixed as a diluent in the manufacturing process of the black paste composition for viscosity control, film manufacture by drying, and contact exposure.

The solvent may be one or more selected from the group consisting of ketone, for example, methylethylketone, cyclohexanone; aromatic Hydrocarbons, for example, toluene, xylene, tetramethylbenzene; glycolether, for example, cellosolve, methylcellosolve, carbitol, methylcarbitol, butylcarbitol, propyleneglycolmonomethylester, dipropyleneglycolmonomethylester, dipropyleneglycolmonoethylester, trietyhtlenglycolmonoethylester; acetic ester, for example, ethyl acetate, butyl acetate, cellosolveacetate, butylcellosolveacetate, carbitolacetate, butylcarbitolacetate, propylenglycolmonomethylesteracetate; alcohol, for example, ethanol, propanol, ethylene glycol, propylene glycol, aliphatic hydrocarbon, for example, octane, decane; and petroleum solvent, for example, petroleum ether, naphtha, naphtha with hydrogen, solvent naphtha.

The upper dielectric layer 260 directly contacts with the bus electrodes 250 made of metallic material, and may be made of PbO-based glass or non-Pb-based glass in order to avoid chemical reactions with the bus electrodes 250. This upper dielectric layer 260 restricts discharge current to maintain glow discharge, and the electric charges generated at the time of plasma discharge are laminated.

The protection layer 270 prevents damage of the upper dielectric layer 260 by sputtering at the time of plasma discharge, and increases the discharge efficiency of the secondary electrons as well. The protection layer 270 is made up of magnesium oxide (MgO).

In the lower plate 300 of PDP, address electrodes 320, a lower dielectric layer 330, barrier ribs 340, and a phosphor layer 350 are disposed on the upper surface of a glass substrate 310 (hereinafter, referred to as "lower substrate").

The address electrodes 320 are positioned at the middle of each discharge cell. The address electrodes 320 may have a line width of about 70 to 80 μm.

The lower dielectric layer 330 is disposed on the entire surface of the lower substrate 310 and the address electrodes 320, and protects the address electrodes 320.

The barrier ribs 340 are positioned on top of the lower dielectric layer 330, spaced by a predetermined distance from the address electrodes 320, and formed longer in the perpendicular direction.

The barrier ribs 340 are needed to maintain the discharge distance, and prevent electrical and optical interference between adjacent discharge cells.

The phosphor layer 350 is formed over both sides of the barrier ribs 340 and the upper surface of the lower dielectric layer 330.

The phosphor layer 350 is excited by the ultraviolet rays generated at the time of plasma discharge, and generates a red (R), green (G) or blue (B) visible ray.

Hereinafter, the light emitting mechanism of PDP will be described in detail.

When a predetermined voltage (within a voltage margin) is applied to the transparent electrode 220 and the bus electrode 250, plasma is formed between adjacent bus electrodes 250 if an additional voltage enough to generate plasma is applied to the address electrodes 320. A certain amount of free electrons exist in gas, and the free electrons receive a force ($F=q \cdot E$) when an electrical field is applied to the gas.

If the electrons to which the force is exerted obtain an energy (the first ionization energy) enough to remove electrons in the outermost orbit, they ionize the gas, and thus generated ions and electrons are moved to both electrodes by the electromagnetic force. Particularly, secondary electrons are generated when the ions collide with the protection layer 250, and these secondary electrons help generation of plasma.

Thus, a high voltage is required to begin an initial discharge, but once a discharge is begun, a lower voltage is required, as the electron density is increased.

The gas provided in the cells of PDP is generally an inert gas, such as Ne, Xe, He, etc. Particularly, a red, green or blue visible ray is generated when an ultraviolet ray with a wavelength of between about 147 nm and 173 nm is applied to the phosphor layer 350.

The visible ray emitted at this time is determined according to the kind of phosphor layer 350, and thus each discharge cell becomes a pixel representing each red, green, or blue color.

The color of each discharge cell is controlled by combination of RGB in each discharge cell. In case of this exemplary PDP, the color is controlled by controlling the time that plasma is generated.

Thus generated visible ray is emitted to the outside of the cell through the upper substrate 210.

Hereinafter, the manufacture process of the upper plate of PDP using the black paste composition of the present invention will be described.

FIGS. 3A-3F are cross-sectional views illustrating the steps of forming the upper plate of PDP of FIG. 2.

Figure 3A:
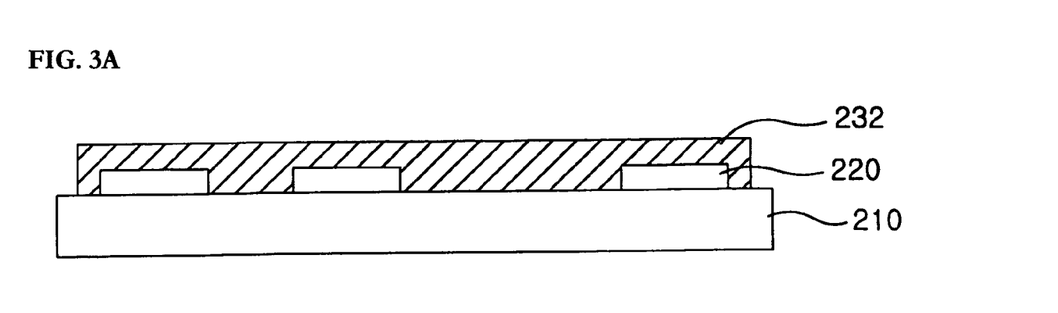
FIGS. 3A-3F are cross-sectional views illustrating the steps of forming the upper plate of PDP of FIG. 2.

As shown in FIG. 3A, the black paste composition 232 is applied onto the upper substrate 210 at the state that the transparent electrode 220, such as ITO, is already formed through sputtering, ion plating, chemical vapor deposition, and electro-deposition processes. And then, the black paste composition 232 is dried to achieve surface treatment. After drying, almost the solvent in the black paste composition may be evaporated.

Figure 3B:
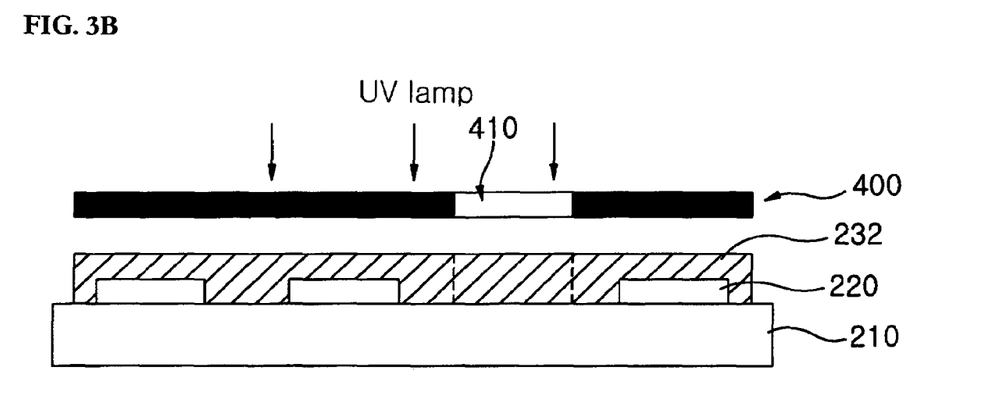

Next, a first mask 400 having a certain opening 410 is disposed on the upper substrate 210 onto which the black paste composition 232 is applied. The opening of the first mask 400 is formed at a corresponding position to a position at which the first black matrix 230 will be formed, as shown in FIG. 3B.

Then, the exposure may be performed on top of the first mask 400 for a certain period of time.

In case of exposing the black paste composition 232 to light, the black paste composition 232 is cured in response to the light. At this time, only a certain part of the black paste composition 232 is cured by the first mask 400 disposed on the black paste composition 232. That is, the black paste composition 232 disposed under the opening 410 is cured by exposing the black paste composition 232 to the light, and the black paste composition 232 disposed under a part in which the opening 410 is not formed is cured because the light cannot pass through.

Figure 3C:
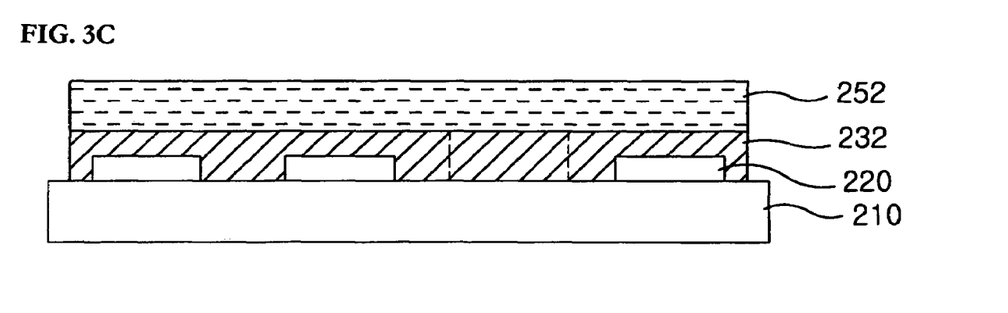

Subsequently, after removing the first mask 400, an electrode material 252 is applied onto the black paste composition 232, as shown in FIG. 3C.

Figure 3D:
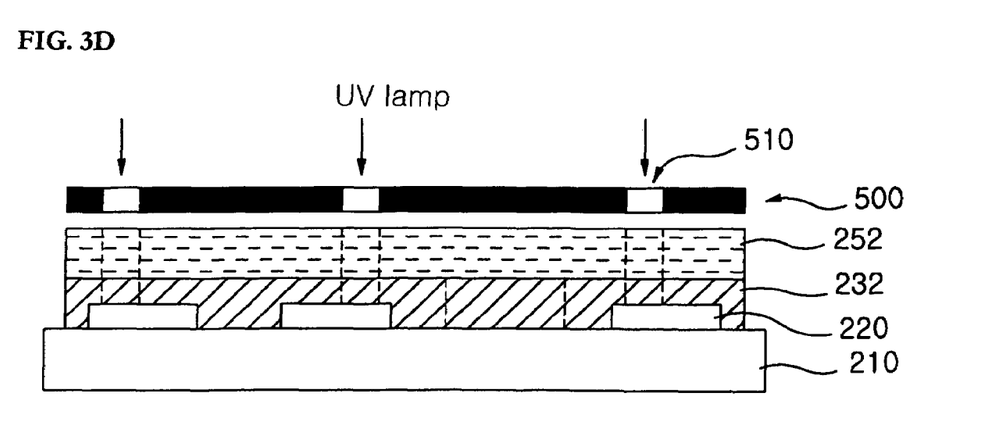

Next, a second mask 500 having a certain opening 510 is disposed on the upper substrate 210 onto which the electrode material 252 is applied. And then, the electrode material 252 is dried to achieve surface treatment.

In the second mask 500, the opening 510 is formed at a position corresponding to a position at which the bus electrode 250 and the second black matrix 240 are formed, as shown in FIG. 3D.

Then, the exposure may be performed on top of the second mask 500, to be exposed to light.

In this case of exposing the electrode material 252 and the black paste composition 232 to light, the electrode material 252 and the black paste composition 232 are cured in response to the light. At this time, only a part of the black paste composition 232 is cured by the second mask 400 on the electrode material 252 and the black paste composition 232. That is, the electrode material 252 and the black paste composition 232 disposed under the opening are cured by exposing the electrode material 252 and the black paste composition 232 to the light, and the electrode material 252 and the black paste composition 232 disposed under a part in which the opening 410 is not formed are not cured because the light cannot pass through.

In case of exposing, the light exposing equipment is used to perform exposure. Exposure is generally carried out with the masked exposure method using a photo mask, as in ordinary photolithography. The mask used may be of a negative type or a positive type.

Direct pattern formation by means of a red or blue visible laser beam or Ar ion laser beam may be performed instead of using a photo mask.

Exposure devices such as stepper exposer or proximity exposer may be used. For light exposure of a large area, a paste or an electrode material may be applied over a glass or other substrate, followed by performing exposure while conveying the substrate to allow a large area to be exposed by means of a light exposer with a small light source.

The active light sources that can be used effectively include visible light, near ultraviolet light, ultraviolet light, electron beam, X-ray, and laser beam. Of these, ultraviolet light is preferred, and such sources as low-pressure mercury lamp, high-pressure mercury lamp, extra-high pressure mercury lamp, halogen lamp, and germicidal lamp can be used. Of these, the extra-high pressure mercury lamp is preferred.

Figure 3E:
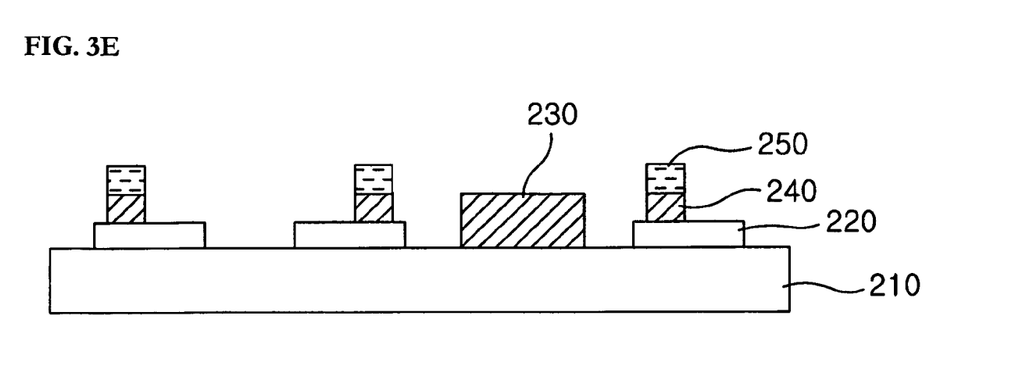

And, a developing process is performed after removing the second mask 500. In the processes of FIG. 3B and FIG. 3D, the other part of the electrode material 252 and the black paste composition 232 is removed, except the cured part in response to the light. Then, a sintering process is performed to complete formation of the bus electrode 250, and the first and second black matrixes 230 and 240, as shown in FIG. 3E.

After sintering, organic materials, such as the binder, the photopolymerization monomer, the photopolymerization initiator, etc., may be burn out. But, inorganic particles, such as heat resistant black pigment, glass powder, etc., remain in the black matrix.

In this manner, the bus electrode 250, the first and second black matrixes 230 and 240 are completed by applying each of the electrode material 252 and the black paste composition 232 once, exposing to light, and then developing/sintering once.

Figure 3F:
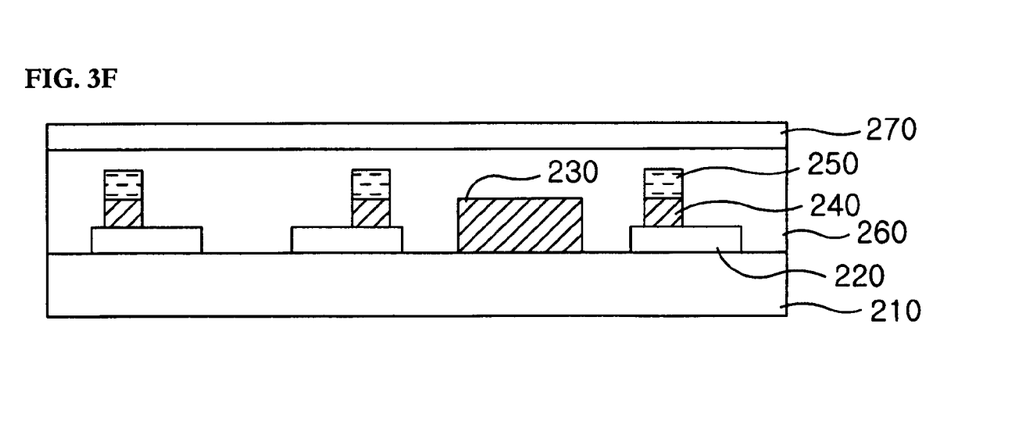

Next, a dielectric material is applied onto the upper substrate 210 on which the transparent electrode 220, the bus electrode 250, the first and second black matrixes 230 and 240 are formed, to form the upper dielectric layer 260, as shown in FIG. 3F.

Then, MgO is applied onto the upper dielectric layer 260 to form the protection layer 270.

Hereinafter, the trial test results to PDP on which the first and second black matrixes are formed according to the above embodiment will be described.

In reference to Table. 1, each component of the black paste composition, and trial test results thereto are as follows.

TABLE 1

|  | Heat resistant black pigment (parts by weight) | Glass powder (parts by weight) | Thickness ($\mu$m) | Resistance ($\Omega$) | Transmissivity (%) |
| --- | --- | --- | --- | --- | --- |
| Comparative example 1 | 14($Co_3O_4$) | 14 | 0.8 | $1.5 \times 10^7$ | 0.48 |
| Example 1 | 14($MnCo_2O_4$) | 14 | 0.76 | $9.7 \times 10^6$ | 0.32 |
| Example 2 | 18($MnCo_2O_4$) | 10 | 0.85 | $5.1 \times 10^6$ | 0.09 |
| Example 3 | 12($MnCo_2O_4$) | 16 | 0.81 | $3.4 \times 10^7$ | 0.38 |

In Table 1, the black paste composition of Comparative Example 1 includes about 14 parts by weight of heat resistant pigment, 14 parts by weight of glass powder, 32 parts by weight of binder, 8 parts by weight of photopolymerization monomer, 4 parts by weight of photopolymerization initiator, and 28 parts by weight of solvent.

$Co_3O_4$ was used as the heat resistant black pigment. Acrylic binder was used as the binder, and n-butylcarbitol was used as the solvent.

The black paste compositions of Example 1 to Example 3 used $MnCo_2O_4$ as the heat resistant black pigment. Also, the other components except heat resistance black pigment and glass powder had same kinds and contents as the components of Comparative Example 1.

The black paste composition of Example 1 includes about 14 parts by weight of heat resistant pigment, 14 parts by weight of glass powder, 32 parts by weight of binder, 8 parts by weight of photopolymerization monomer, 4 parts by weight of photopolymerization initiator, and 28 parts by weight of solvent.

The black paste composition of Example 2 includes about 18 parts by weight of heat resistant pigment, 10 parts by weight of glass powder, 32 parts by weight of binder, 8 parts by weight of photopolymerization monomer, 4 parts by weight of photopolymerization initiator, and 28 parts by weight of solvent.

The black paste composition of Example 3 includes about 12 parts by weight of heat resistant pigment, 16 parts by weight of glass powder, 32 parts by weight of binder, 8 parts by weight of photopolymerization monomer, 4 parts by weight of photopolymerization initiator, and 28 parts by weight of solvent.

After forming the first and second black matrixes by using the black paste compositions, the results evaluating the properties of PDP are shown in Table 1.

In this case, Comparative Example 1 formed the black matrix by a process in the art, and Example 1 to Example 3 formed the black matrix by the process according to the present invention.

According to the test results, the thickness of the black matrix in Example 1 to Example 3 is similar to that of Comparative Example 1. Generally, in case the sintering thickness is more than 1 μm, the property of the black matrix does not satisfy the standard. Thus, it is confirmed that Example 1 to Example 3 according to the present invention show satisfying property.

In the resistance, Example 1 to Example 3 were similar to Comparative Example 1. In case the resistance is very low, the property of the black matrix is below the standard. Thus, it is confirmed that Example 1 to Example 3 according to the present invention show satisfying property.

The lower the transmissivity is, the more the black matrix's property is improved. Compared with Comparative Example 1, it is confirmed that Example 1 to Example 3 have lower transmissivity.

It is confirmed that the black matrix manufactured by using the black paste composition according to the present invention shows similar or more improved properties.

From the preferred embodiments of the present invention, it should be noted that modifications and variations can be made by a person skilled in the art in light of the above teachings. Therefore, it should be understood that changes may be made for a particular embodiment of the present invention within the scope and spirit of the present invention outlined by the appended claims.

What is claimed is:

1. A black paste composition for black matrix, comprising:
   about 5 to 25% by weight of a heat resistant black pigment based on the weight of the entire black paste composition;
   about 5 to 20% by weight of a glass powder based on the weight of the entire black paste composition;
   about 25 to 30% by weight of a binder based on the weight of the entire black paste composition;
   about 5 to 15% by weight of a photopolymerization monomer based on the weight of the entire black paste composition;
   about 1 to 10% by weight of a photopolymerization initiator based on the weight of the entire black paste composition; and
   about 20 to 35% by weight of a solvent based on the weight of the entire black paste composition, wherein the heat resistant black pigment is $MnCo_2O_4$.

2. The composition of claim 1, wherein a content ratio of the glass powder: the heat resistant black pigment falls within a range between about 1:0.5 and about 1:3.

3. The composition of claim 1, wherein the glass powder has a main component containing at least one selected from the group consisting of lead oxide, bismuth oxide, lithium oxide and zinc oxide.

4. The composition of claim 1, wherein the binder is an acrylic binder.

* * * * *